United States Patent
Wei et al.

(10) Patent No.: US 11,974,475 B2
(45) Date of Patent: Apr. 30, 2024

(54) FLEXIBLE DISPLAY PANEL, DISPLAY DEVICE AND FORMING METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yulong Wei, Beijing (CN); Xiangdan Dong, Beijing (CN); Jun Yan, Beijing (CN); Mengmeng Du, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 301 days.

(21) Appl. No.: 17/425,222

(22) PCT Filed: Feb. 28, 2020

(86) PCT No.: PCT/CN2020/077264
§ 371 (c)(1),
(2) Date: Jul. 22, 2021

(87) PCT Pub. No.: WO2021/168828
PCT Pub. Date: Sep. 2, 2021

(65) Prior Publication Data
US 2022/0320239 A1    Oct. 6, 2022

(51) Int. Cl.
*H10K 59/131*    (2023.01)
*H10K 59/122*    (2023.01)
(Continued)

(52) U.S. Cl.
CPC ......... *H10K 59/131* (2023.02); *H10K 59/122* (2023.02); *H10K 59/40* (2023.02); *H10K 77/111* (2023.02); *G06F 3/0412* (2013.01)

(58) Field of Classification Search
CPC .... H10K 59/131; H10K 59/122; H10K 59/40; H10K 77/111; H10K 2102/311;
(Continued)

(56) References Cited

U.S. PATENT DOCUMENTS

2014/0240985 A1    8/2014    Kim et al.
2017/0262109 A1*   9/2017    Choi ................... H01L 27/1218
(Continued)

FOREIGN PATENT DOCUMENTS

CN    109560109 A    4/2019
CN    109585494 A    4/2019
(Continued)

OTHER PUBLICATIONS

International Search Report and Written Opinion for Application No. PCT/CN2020/077264, dated Nov. 27, 2020, 9 Pages.

*Primary Examiner* — Kyoung Lee
(74) *Attorney, Agent, or Firm* — BROOKS KUSHMAN P.C.

(57) ABSTRACT

A flexible display panel, a display device and a forming method are provided. The flexible display panel includes a display area and a non-display area, where the non-display area includes a bending sub-area and a binding sub-area, and the bending sub-area is configured to bend the binding sub-area to a side away from the display area, the bending sub-area includes a first organic layer, a second organic layer and a metal wiring layer between the first organic layer and the second organic layer arranged on the substrate, the touch wiring layer is electrically connected to the metal wiring layer; in response to the bending sub-area being in a bending
(Continued)

state, a vertical distance from a bending neutral layer of the bending sub-area to the metal wiring layer is smaller than a preset distance.

16 Claims, 10 Drawing Sheets

(51) Int. Cl.
*H10K 59/40* (2023.01)
*H10K 77/10* (2023.01)
*G06F 3/041* (2006.01)

(58) Field of Classification Search
CPC . H10K 50/844; G06F 3/0412; G06F 3/04164; G06F 3/0443; G06F 3/0446; G06F 2203/04102; G06F 2203/04103; Y02E 10/549; G09F 9/33
See application file for complete search history.

(56) References Cited

U.S. PATENT DOCUMENTS

| | | |
|---|---|---|
| 2018/0331319 A1 | 11/2018 | Hiraga et al. |
| 2019/0095007 A1 | 3/2019 | Jeong et al. |
| 2019/0096974 A1 | 3/2019 | Kim |
| 2021/0184139 A1 | 6/2021 | Zhang et al. |

FOREIGN PATENT DOCUMENTS

| | | |
|---|---|---|
| CN | 109755256 A | 5/2019 |
| CN | 109817675 A | 5/2019 |
| CN | 110197845 A | 9/2019 |
| CN | 110515499 A | 11/2019 |

\* cited by examiner

FLEXIBLE DISPLAY PANEL, DISPLAY DEVICE AND FORMING METHOD

CROSS-REFERENCE TO RELATED APPLICATION

This application is the U.S. national phase of PCT Application No. PCT/CN2020/077264 filed on Feb. 28, 2020, which is incorporated herein by reference in its entirety.

TECHNICAL FIELD

The disclosure relates to the technical field of flexible display, and in particular to a flexible display panel, a display device and a forming method.

BACKGROUND

Organic Light-Emitting Diode (OLED) is a new display technology, and has the characteristics of active light emission, high brightness, wide viewing angle, fast response speed, low energy consumption, flexibility and the like, so that the Organic Light-Emitting Diode (OLED) receives more and more attention, and becomes a next generation display technology capable of replacing liquid crystal display.

The flexible OLED display technology is becoming mature continuously, and the types of flexible display products are diversified continuously; frameless product has become a market mainstream. In order to save drive division's occupation space, improve the screen-to-bod ratio, reach comprehensive screen display effect, when assembling the flexible OLED display panel in the related art, a part of the driving area of the display panel is bent to the back of the display panel. However, in the process of bending the bending area, the metal wires in the bending area are easily broken due to the stress, thereby causing wire defects.

SUMMARY

The purpose of the embodiments of the present disclosure is to provide a flexible display panel, a display device, and a forming method, which solve the problem that when a driving portion of the flexible display panel in the prior art is bent to the back of the display panel, a metal trace is easily broken.

In order to achieve the above object, the present disclosure provides a flexible display panel, which includes a display area and a non-display area, where the non-display area includes a bending sub-area and a binding sub-area, and the bending sub-area is configured to bend the binding sub-area to a side away from the display area;

the display area includes a driving circuit layer arranged on a substrate, the driving circuit layer includes a source/drain electrode layer, a planarization layer arranged at a side, far away from the substrate, of the source/drain electrode layer, a pixel defining layer arranged at a side, far away from the substrate, of the planarization layer and a touch wiring layer arranged at a side, far away from the substrate, of the pixel defining layer, the bending sub-area includes a first organic layer, a second organic layer and a metal wiring layer between the first organic layer and the second organic layer arranged on the substrate, the touch wiring layer is electrically connected to the metal wiring layer, and an orthographic projection of the touch wiring layer on a plane of the substrate is not located in the bending sub-area;

in response to the bending sub-area being in a bending state, a vertical distance from a bending neutral layer of the bending sub-area to the metal wiring layer is smaller than a preset distance.

Optionally, the metal wiring layer is arranged in a same layer as the source/drain electrode layer.

Optionally, the display region further includes a first electrode within the pixel defining layer, a light-emitting layer at a side of the first electrode away from the substrate and a second electrode at a side of the light-emitting layer away from the substrate; the first electrode is connected to the source/drain electrode layer through a transfer metal layer, and the metal wiring layer and the transfer metal layer are arranged on the same layer.

Optionally, the planarization layer includes a first planarization layer and a second planarization layer, where the transfer metal layer is on the first planarization layer and within the second planarization layer, and the transfer metal layer is connected to the source/drain electrode layer through a first via hole penetrating through the first planarization layer; the first electrode is connected to the transfer metal layer through a second via hole penetrating through the second planarization layer.

Optionally, the first organic layer is closer to the substrate than the second organic layer, the first organic layer is in the same layer as the first planarization layer, the second organic layer is in the same layer as the second planarization layer and the pixel defining layer.

Optionally, the bending neutral layer overlaps the metal wiring layer in response to the bending sub-area being in a bent state.

Optionally, the metal wiring layer is located at one-half of a thickness of the bending sub-area in response to the bending sub-area being not in the bent state.

Optionally, a thickness adjusting layer is at a side of the second organic layer away from the metal wiring layer in the bending sub-area;

through the thickness adjusting layer, in response to the bending sub-area being in a bending state, a vertical distance from the bending neutral layer of the bending sub-area to the metal wiring layer is smaller than a preset distance.

Optionally, the thickness adjusting layer further extends to the display area and is located at a side of the touch wiring layer away from the substrate.

Optionally, the thickness adjusting layer is an organic material layer.

Optionally, the substrate includes a first organic material, a second organic material, and at least one inorganic layer between the first organic material and the second organic material.

Optionally, the bending neutral layer is located at a side of the metal wiring layer proximate to the substrate.

Optionally, the preset distance is less than or equal to 5 microns.

A display device including the flexible display panel above is further provided in the present disclosure.

Optionally, a driving component is arranged on the binding sub-area on the non-display region, and the metal wiring layer is electrically connected to the driving component;

the bending sub-area is bent relative to the display area, and the driving component is arranged at a side away from the display area.

A method of forming a flexible display panel above is further provided in the present disclosure, including:

providing a substrate; and forming a display area and a non-display area on the substrate;

where the non-display area includes a bending sub-area and a binding sub-area, and the bending sub-area is configured to bend the binding sub-area to a side away from the display area;

the display area includes a driving circuit layer arranged on a substrate, the driving circuit layer includes a source/drain electrode layer, a planarization layer arranged at a side, far away from the substrate, of the source/drain electrode layer, a pixel defining layer arranged at a side, far away from the substrate, of the planarization layer and a touch wiring layer arranged at a side, far away from the substrate, of the pixel defining layer, the bending sub-area includes a first organic layer, a second organic layer and a metal wiring layer between the first organic layer and the second organic layer arranged on the substrate, the touch wiring layer is electrically connected to the metal wiring layer, and an orthographic projection of the touch wiring layer on a plane of the substrate is not located in the bending sub-area;

in response to the bending sub-area being in a bending state, a vertical distance from a bending neutral layer of the bending sub-area to the metal wiring layer is smaller than a preset distance.

BRIEF DESCRIPTION OF THE DRAWINGS

In order to more clearly illustrate the technical solutions in the present embodiment or related technologies of the present disclosure, the drawings used in the description of the embodiments will be briefly introduced below, it is obvious that the drawings in the following description are only some embodiments of the present disclosure, and it is obvious for those skilled in the art that other drawings may be obtained according to the drawings without creative efforts.

DETAILED DESCRIPTION

The technical solutions in the embodiments of the present disclosure will be described below clearly and completely with reference to the accompanying drawings in the embodiments of the present disclosure, and it is obvious that the described embodiments are only some embodiments of the present disclosure, not all embodiments. All other embodiments, which may be derived by a person skilled in the art from the embodiments disclosed herein without making any creative effort, shall fall within the scope of the present disclosure.

The main purpose of the embodiments of the present disclosure is to provide a flexible display panel, a display device, and a forming method, which solve the problem that when a driving portion of the flexible display panel in the prior art is bent to the back of the display panel, a metal trace is easily broken.

Figure 1:
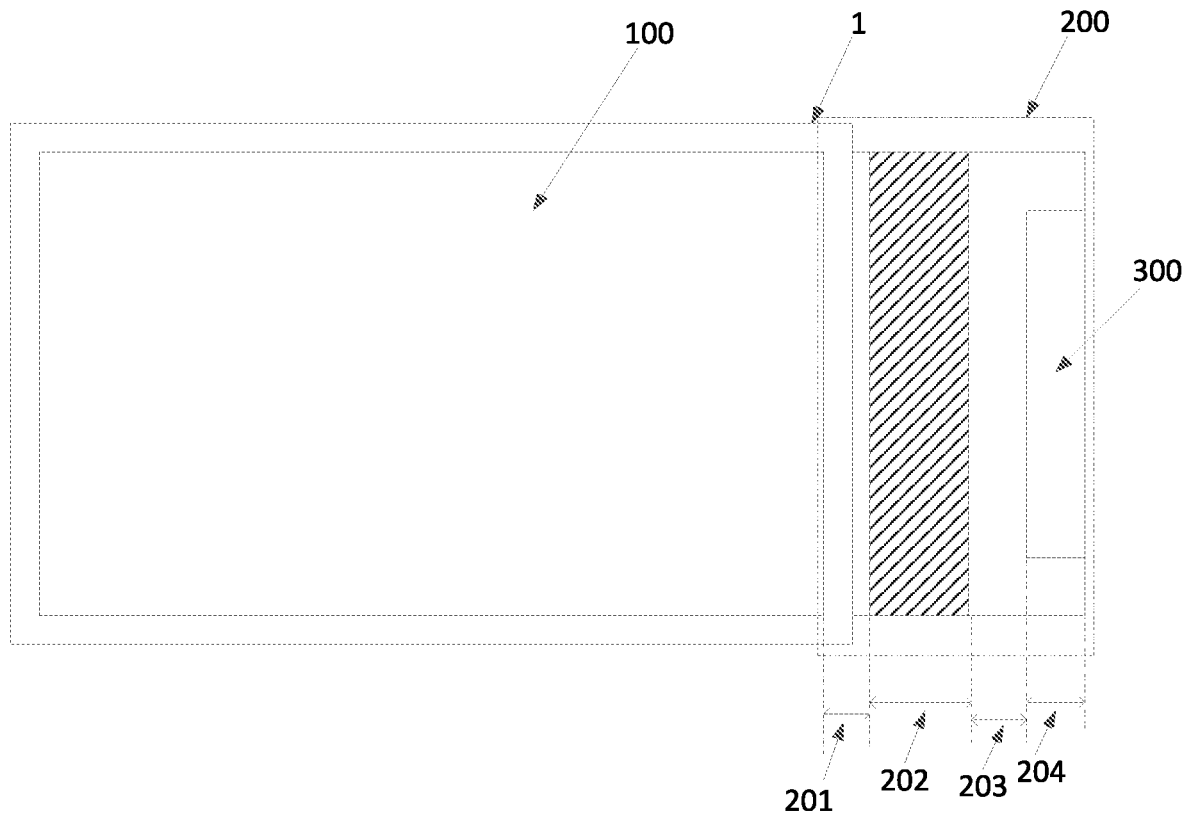
FIG. 1 is a schematic view of an unfolded state of a flexible display substrate according to the present disclosure.
Figure 2:
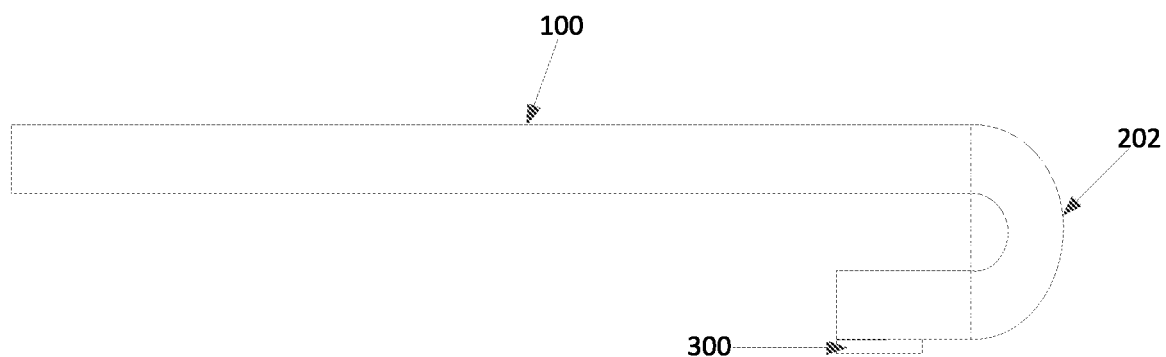
FIG. 2 is a schematic view of a curved state of a flexible display substrate according to the present disclosure.

The flexible display panel according to the embodiment of the present disclosure, as shown in FIGS. 1 and 2, includes a display area 100 and a non-display area 200 at one end of the display area 100. In the direction from the display area 100 to the display area 100, the non-display area 200 includes a first transition sub-area 201, a bending sub-area 202, a second transition sub-area 203, and a binding sub-area 204, where the bending sub-area 202 includes a planar state (as shown in FIG. 1) located on the same plane as the display area 100, and a bending state (as shown in FIG. 2) bent relative to the display area 100.

The flexible display panel comprises a substrate 1, where a display function device is formed on the substrate 1 and used for realizing a display function, and the display function device is correspondingly formed into a display area 100 in an area arranged on the substrate 1; on the substrate 1, the area where the display function device is not arranged is a non-display area 200, where the driving component 300 is arranged on the binding sub-area 204 of the non-display area 200. The bending sub-area 202 is located between the binding sub-area 204 and the display region 100, and is configured to bend the binding sub-area 204 to a side away from the display region 100, so that the driving component 300 on the binding sub-area 204 is connected to the flexible circuit board of the display device.

In the embodiment of the present disclosure, the substrate 1 is a flexible transparent substrate, and can realize bending of the display panel.

In the embodiment of the present disclosure, the driving component 300 includes, but is not limited to, a driving chip and a flexible circuit board, and a metal wiring layer is arranged on the bending sub-area 202 and electrically connected to the driving component 300, and the metal wiring layer can transmit a control signal on the driving component 300 to the display area 100 to control image display or touch operation of the display area 100.

Referring to FIG. 2, in the flexible display panel according to the embodiment of the present disclosure, when the bending sub-area 202 is bent toward a side away from the display region 100 with respect to the display region 100, and is in a bending state, the driving component 300 located on the non-display region 200 and far away from the display region 100 may be bent to the back of the display region 100, so as to complete the next module assembly, thereby reducing the display frame of the display region 100 of the flexible display panel and achieving the effect of narrow-frame display. In order to solve the issue that, in the process of assembling the flexible display panel, when bending the sub-area 202, the sub-area 202 may be subjected to a great stress, and the stress concentrates on the metal wiring layer of sub-area 202 that being bent, cause the metal wiring layer to be broken easily, this embodiment of the disclosure flexible display panel, as shown in FIG. 3, when the bending sub-area 202 is in the state of bending, by making a vertical distance h between the metal wiring layer 211 and the bending neutral layer 212 to be less than preset distance, the metal wiring layer 211 may be close to the bending neutral layer 212 as far as possible, thereby reducing the stress on the metal wiring layer 211 of the bending sub-area 202, avoiding metal wiring layer 211 from being broken.

Optionally, the preset distance is less than or equal to 5 microns.

It should be noted that the principle of setting the preset distance may be as follows: the bending test experiment is performed on the bending sub-area 202, and the critical value of the preset distance that can satisfy the preset test condition is the set value of the preset distance. It is understood that, depending on the total thickness of the bending sub-area 202, the material and thickness of each film layer on the bending sub-area 202, there is a corresponding difference in the preset distance.

Figure 3:
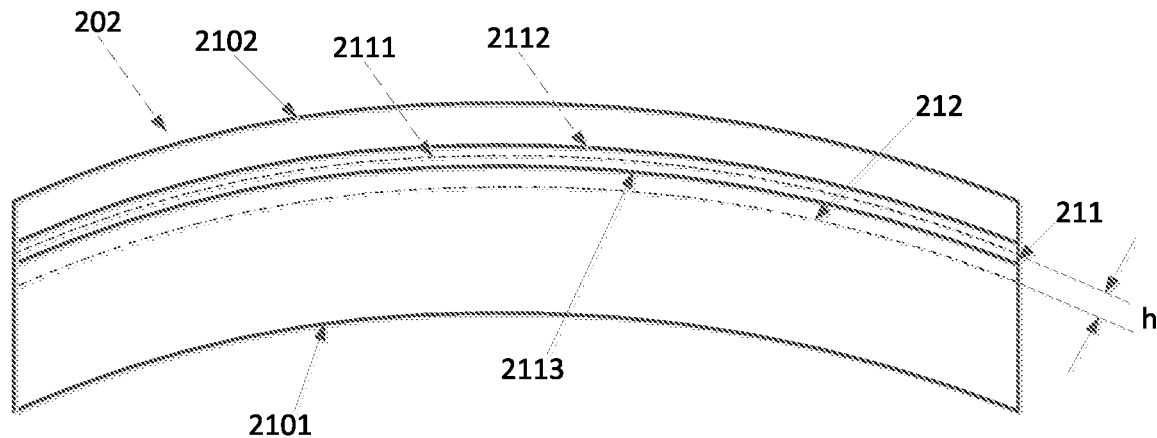
FIG. 3 is a schematic cross-sectional view of a bending sub-area in a bending state according to an embodiment of the disclosure.

In one embodiment of the present disclosure, as shown in FIG. 3, a vertical distance h from the metal wiring layer 211 to the bending neutral layer 212 may be defined as a vertical distance from a central plane 2111 of the metal wiring layer 211 to the bending neutral layer 212.

In the disclosed embodiment, as shown in FIG. 3, a central plane 2111 of metal wiring layer 211 is located between opposing first and second side surfaces 2112, 2113 of metal wiring layer 211, and is equidistant from first and second side surfaces 2112, 2113.

In particular, it may be appreciated that the metal wiring layer 211 is formed as a thin layer structure, the first side surface 2112 and the second side surface 2113 are two opposite sides of the metal wiring layer 211 forming a side of the layer structure, and in any bending state, the central plane 2111 is a plane parallel to the first side surface 2112 and the second side surface 2113 between the first side surface 2112 and the second side surface 2113, and is equidistant from the first side surface 2112 and the second side surface 2113.

In the embodiment of the present disclosure, the vertical distance from the central plane 2111 to the bending neutral layer 212 includes the vertical distance from each position point on the central plane 2111 to the bending neutral layer 212, and in the flexible display panel, the vertical distance h from each position point on the central plane 2111 to the bending neutral layer 212 is less than the preset distance.

Figure 4:
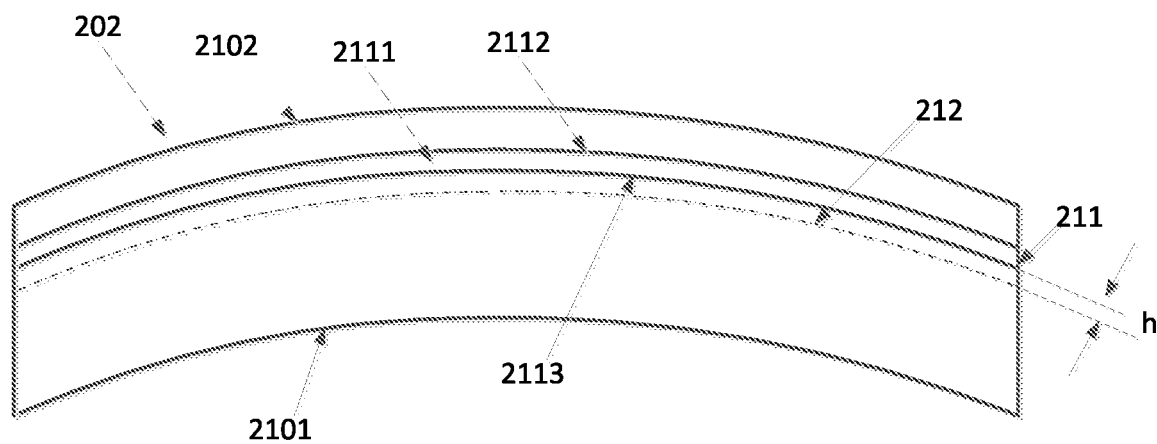
FIG. 4 is a second schematic cross-sectional view of a bending sub-area in a bending state according to an embodiment of the disclosure.

In another embodiment of the present disclosure, as shown in FIG. 4, since the metal wiring layer 211 is generally formed as a thin layered structure, without precise requirement, the vertical distance h from the metal wiring layer 211 to the bending neutral layer 212 may also be defined as the vertical distance from the side surface of the metal wiring layer 211 close to the bending neutral layer 212. For example, when the bending neutral layer 212 is closer to the second side surface 2113 of the metal wiring layer 211 than to the first side surface 2112, the vertical distance h from the metal wiring layer 211 to the bending neutral layer 212 may be defined as the distance from the second side surface 2113 of the metal wiring layer 211 to the bending neutral layer 212. It should be noted that, as shown in FIG. 2, FIG. 3 and FIG. 4, when bending sub-area 202 is in a bending state, a compressive stress is generated on the first surface 2101, and a tensile stress is generated on the opposite second surface 2102, based on which at each position point in the direction from the first surface 2101 to the second surface 2102 on the cross section of bending sub-area 202, the compressive stress is gradually transited to the tensile stress, and therefore, there are inevitably position points which are not subjected to the compressive stress or the tensile stress, and the planes of the position points are bending neutral layers 212. When the bending sub-area 202 is in a bent state, the bending neutral layer 212 will not be deformed.

Figure 5:
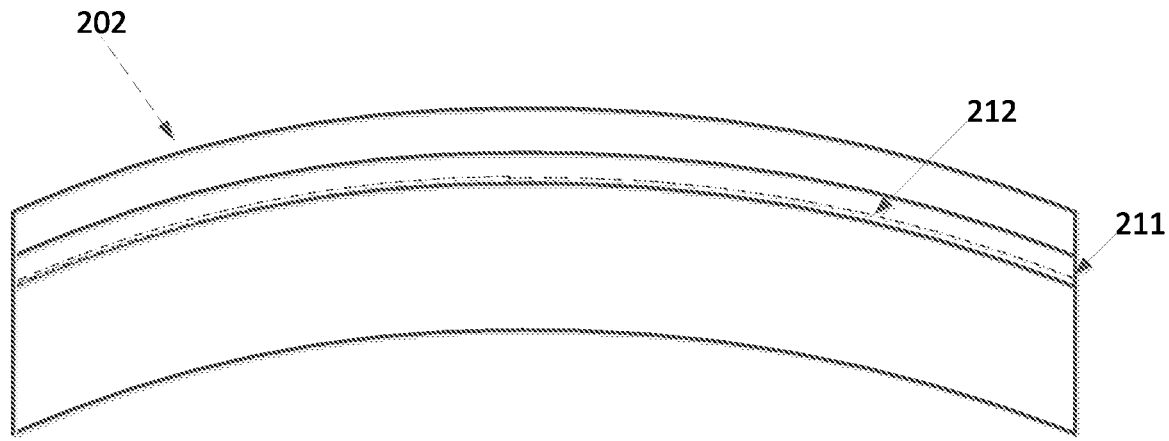
FIG. 5 is a third schematic cross-sectional view of a bending sub-area in a bending state according to an embodiment of the disclosure.

Further, the bending sub-areas 202 have different deformation degrees when in different bending states, where the positions of the bending neutral layers 212 in different deformation degrees are slightly different, in the flexible display panel according to the embodiment of the present disclosure, when the bending sub-areas 202 are in any bending state that is bent away from a side of the display region 100, the vertical distance h from the metal wiring layer 211 to the bending neutral layers 212 is smaller than the preset distance, so as to effectively solve the problem that the metal wiring is easily broken when the bending sub-areas 202 of the flexible display panel are bent to the back of the display panel. In one embodiment of the present disclosure, as shown in FIG. 5, when the bending sub-area 202 is in the bending state, the bending neutral layer 212 overlaps the metal wiring layer 211. That is, the bending neutral layer 212 is located on the metal wiring layer 211, and the distance from the metal wiring layer 211 to the bending neutral layer 212 is zero.

Specifically, by locating the bending neutral layer 212 on the metal wiring layer 211, a tensile stress or a compressive stress on the metal wiring layer 211 caused by bending the bending sub-area 202 may be avoided, so that the metal wiring layer 211 may be effectively prevented from being broken.

Figure 6:
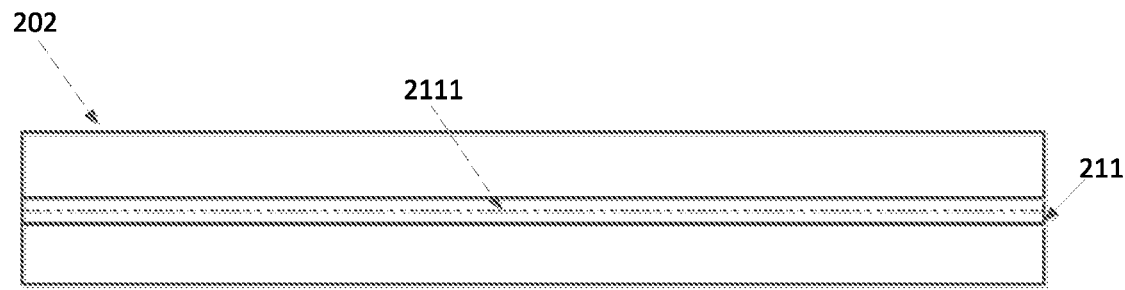
FIG. 6 is a schematic cross-sectional view of a bending sub-area in a planar state according to an embodiment of the present disclosure.

In one embodiment of the present disclosure, as shown in FIG. 1 and FIG. 6, the bending sub-area 202 further includes a planar state of the same layer as the display area 100, and in the planar state, the central plane 2111 of the metal wiring layer 211 is located at one-half the thickness of the bending sub-area 202.

Figure 7:
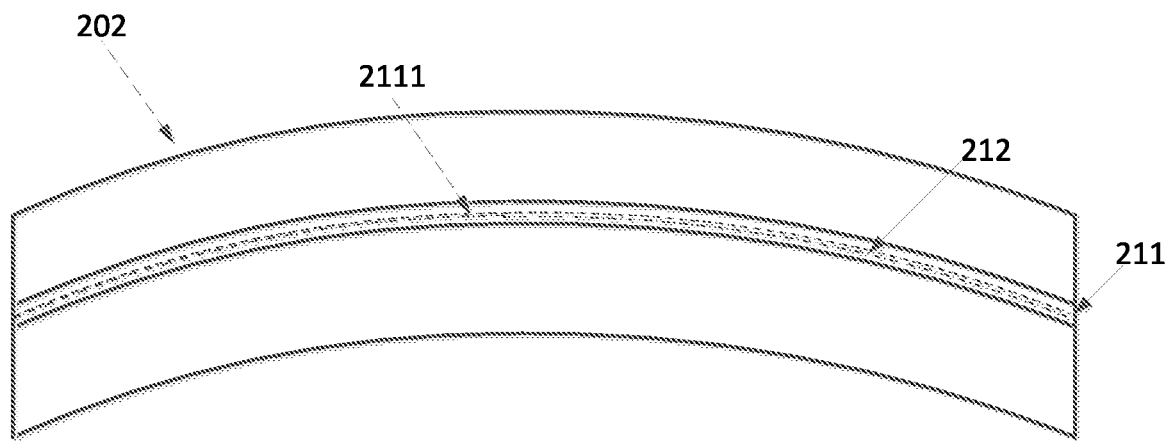
FIG. 7 is a third schematic cross-sectional view of a bending sub-area in a bending state according to an embodiment of the disclosure.

By having the center plane 2111 of the metal wiring layer 211 located at one-half the thickness of the bending sub-area 202 in the planar state, as shown in FIG. 7, it is ensured that the center plane 2111 of the metal wiring layer 211 may be closer to the bending neutral layer 212 when the bending sub-area 202 is bent.

In one embodiment of the flexible display panel of the present disclosure, the relative position of the metal wiring layer 211 between the first surface 2101 and the second surface 2102 of the bending sub-area 202 may be adjusted by setting the total thickness of the bending sub-area 202, so as to satisfy at least one of the following implementation structures:

the vertical distance from the metal wiring layer 211 to the bent neutral layer 212 is less than a preset distance;
the neutral layer 212 is overlapped with the metal wiring layer 211;
in the planar state, the central plane 2111 of the metal wiring layer 211 is located at one-half of the thickness of the bending sub-area 202.

Figure 8:
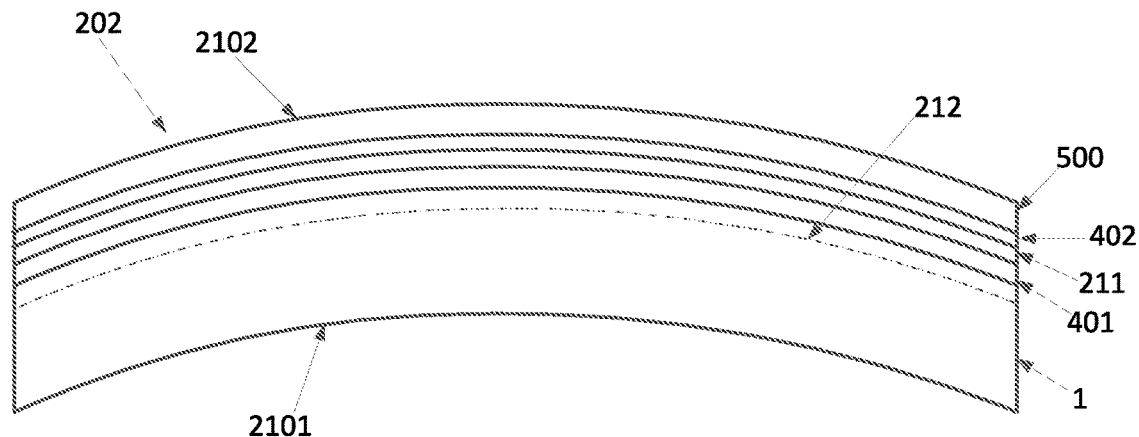
FIG. 8 is a fourth schematic cross-sectional view of a bending sub-area in a bending state according to an embodiment of the present disclosure.

In one embodiment of the flexible display panel of the present disclosure, as shown in FIG. 8, a substrate 1 is arranged at a side of a metal wiring layer 211 in a bending sub-area 202, a first organic layer 401, the metal wiring layer 211, and a second organic layer 402 are sequentially arranged on the substrate 1, and a thickness adjusting layer 500 is further arranged at a side of the second organic layer 402 away from the substrate 1;

through the thickness adjusting layer 500, in the bending state, the vertical distance from the metal wiring layer 211 to the bending neutral layer 212 is less than a preset distance.

Specifically, on the basis that the first organic layer 401, the metal wiring layer 211 and the second organic layer 402 are arranged in the bending sub-area 202, the thickness adjusting layer 500 is arranged to adjust the total thickness of the bending sub-area 202 and the relative position of the metal wiring layer 211 between the first surface 2101 and the second surface 2102 of the bending sub-area 202, so as to ensure that the vertical distance from the metal wiring layer 211 to the bending neutral layer 212 is less than the preset distance.

The following describes a specific implementation structure of the flexible display panel according to an embodiment of the present invention in detail with reference to specific embodiments.

Figure 9:
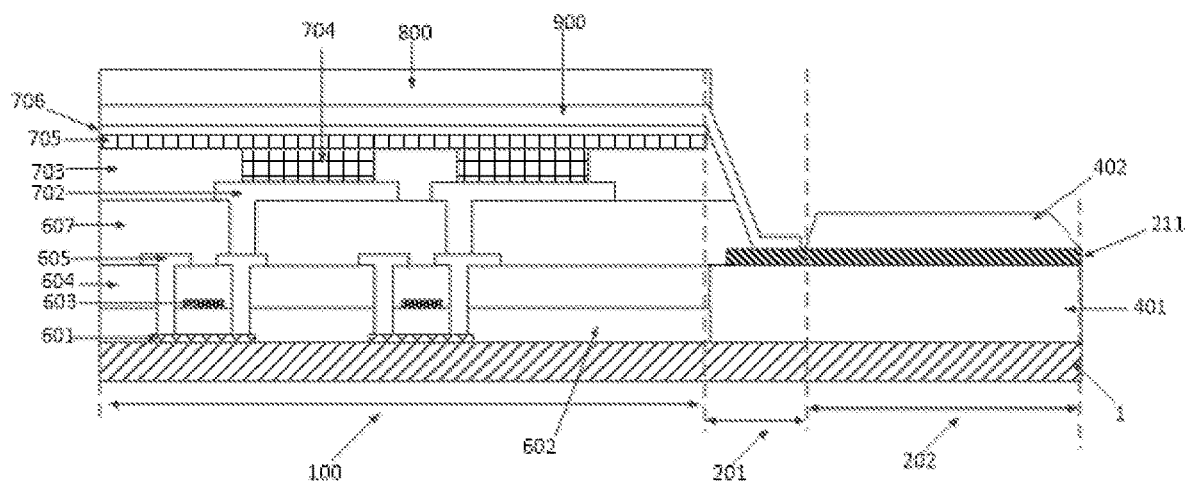
FIG. 9 is a schematic cross-sectional view of a flexible display panel according to the present disclosure.

As shown in FIG. 9, in the flexible display panel according to one embodiment of the present disclosure, taking the flexible display panel as a top emission OLED display panel and having a touch function as an example, the flexible display panel includes a display area 100 and a non-display area 200, where the non-display area 200 includes a bending sub-area 202 and a binding sub-area, where the binding sub-area is not shown in FIG. 9, and referring to FIG. 1, the binding sub-area is located at a side of the bending sub-area 202 away from the display area 100, and the bending sub-area 202 is used to bend the binding sub-area to a side away from the display area 100;

the display area 100 comprises a driving circuit layer arranged on a substrate 1, the driving circuit layer comprises a source/drain electrode layer 605, a planarization layer 607 arranged at a side, far away from the substrate 1, of the source/drain electrode layer 605, a pixel defining layer 703 arranged at a side, far away from the substrate 1, of the planarization layer 607, and a touch wiring layer 900 arranged at a side, far away from the substrate 1, of the pixel defining layer 703, the bending sub-area 202 comprises a first organic layer 401 arranged on the substrate 1, a second organic layer 402, and a metal wiring layer 211 arranged between the first organic layer 401 and the second organic layer 402, the touch wiring layer 900 is electrically connected to the metal wiring layer 211, and the orthographic projection of the touch wiring layer 900 on the plane of the substrate 1 is not located in the bending sub-area 202;

when the bending sub-area 202 is in a bending state, a vertical distance from a bending neutral layer of the bending sub-area 202 to the metal wiring layer is smaller than a preset distance.

Further, specifically, the flexible display panel further includes an active layer 601, a gate insulating layer 602, a gate 603, and an interlayer insulating layer 604 sequentially formed on the substrate 1, where a source/drain layer 605 is formed on the interlayer insulating layer 604; and further comprising a light emitting device layer between the driver circuit layer and the touch wiring layer 900, the light emitting device layer comprising a first electrode 702, a light emitting layer 704 arranged at a side of the first electrode 702 remote from the substrate 1, and a second electrode 705 arranged at a side of the light emitting layer 704 remote from the substrate 1; optionally, a spacer layer 706 is further arranged on the second electrode 705. Here, a pixel defining layer 703 is arranged on the first electrode 702, and a light emitting layer 704 is arranged in the pixel defining layer 703. Optionally, the spacer layer 706 includes two inorganic layers opposite to each other and an organic layer between the two inorganic layers.

The first electrode 702 is connected to the source/drain layer 605 through a via hole of the planarization layer 607, and the light emitting device may be driven to emit light through the driving circuit layer.

In the embodiment of the present disclosure, optionally, the first electrode 702 is an anode, and the second electrode 705 is a cathode. The light emitting layer 704 includes a hole injection layer, a hole transport layer, a light emitting layer, an electron transport layer, and an electron injection layer, which are sequentially arranged. In the embodiment of the present disclosure, optionally, the touch wiring layer 900 is arranged on the spacer layer 706, and optionally, the flexible display panel further includes an encapsulation layer 800 arranged on the touch wiring layer 900.

In this embodiment, the touch trace layer 900 on the display area 100 is connected to the metal trace layer 211 on the bending sub-area 202, so that the touch signal lines may be transmitted to the driving elements on the binding sub-area through the metal trace layer 211.

In the embodiment of the present disclosure, in order to ensure that the perpendicular distance from the bending neutral layer of the bending sub-area 202 to the metal wiring layer 211 is smaller than the preset distance when the bending sub-area 202 is in the bent state, optionally, the total thickness of the bending sub-area 202 may be adjusted by adjusting the thickness of the first organic layer 401 and/or the second organic layer 402, so as to adjust the thickness from the metal wiring layer 211 to the bending neutral layer of the bending sub-area 202.

In particular, the positional relationship between the metal wiring layer 211 and the bending neutral layer of the bending sub-area 202 may be found in conjunction with FIGS. 1 to 8 and with reference to the above detailed description.

Figure 10:
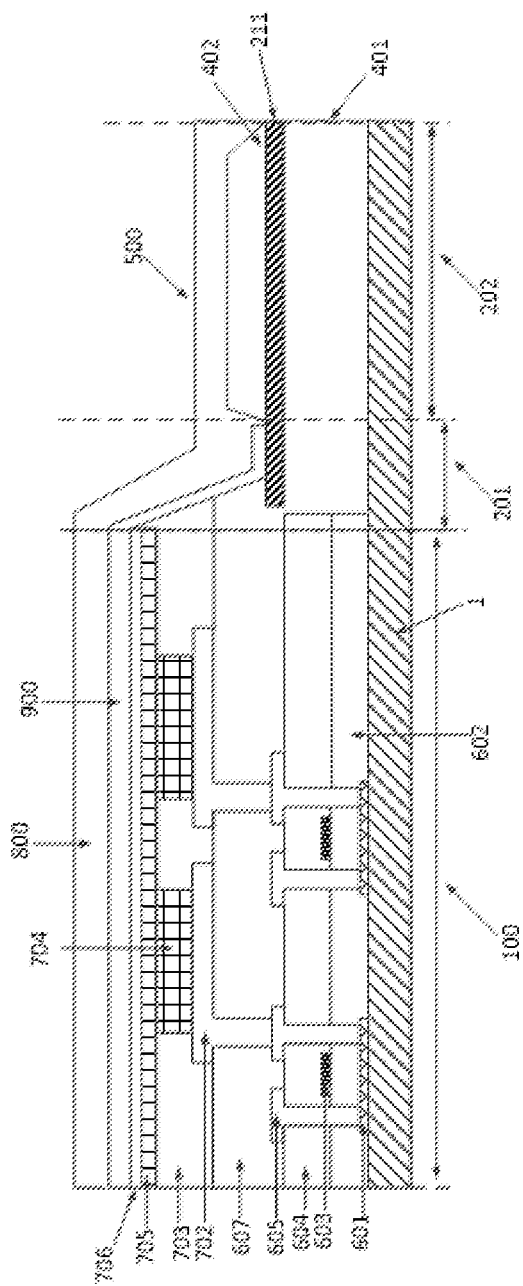
FIG. 10 is a second schematic cross-sectional view of a flexible display panel according to the present disclosure.

In another embodiment of the present disclosure, referring to FIG. 10, the display area 100 of the flexible display panel includes the driving circuit layer and the light emitting device layer of the above-mentioned implementation structure, and the bending sub-area 202 includes the first organic layer 401, the second organic layer 402 and the metal wiring layer 211 located between the first organic layer 401 and the second organic layer 402, which are arranged on the substrate 1, on the basis of the arrangement structure of the touch wiring layer 900 electrically connected to the metal wiring layer 211, the bending sub-area 202, the metal wiring layer 211 and the source/drain electrode layer 605 are arranged in the same layer, the first organic layer 401 located between the metal wiring layer 211 and the substrate 1 may be arranged in the same layer with the planarization layer 607, and the second organic layer 402 may be arranged in the same layer with the pixel defining layer 703.

Based on the above embodiment, since the thicknesses of the interlayer insulating layer 604, the gate insulating layer 602, the pixel defining layer 703 and the planarization layer 607 are generally within a predetermined range in the fabrication of the display device, for example, the substrate 1 is about 100000 angstroms, the gate insulating layer 602 is about 1200 to 1400 angstroms, the interlayer insulating layer 604 is about 4000 to 6000 angstroms, the pixel defining layer 703 is generally 14000 to 16000 angstroms, and the planarization layer 607 is generally 20000 angstroms, since the thickness of the substrate 1 is much greater than the thickness of each layer arranged on the substrate, in order to ensure that the perpendicular distance from the bending neutral layer of the bending sub-area 202 to the metal wiring layer 211 in the bending sub-area 202 is smaller than a preset distance, optionally, a thickness adjusting layer 500 is further arranged on the second organic layer 402 away from the substrate 1 on the bending sub-area 202, and the overall thickness of the bending sub-area 202 is adjusted by the thickness adjusting layer 500.

In one embodiment of the present disclosure, optionally, the encapsulation layer 800 of the display area 100 extends to the bending sub-area 202, is arranged on the second organic layer 402 of the bending sub-area 202, and is formed as the thickness adjusting layer 500 of the bending sub-area 202.

Optionally, the encapsulation layer 800 includes a first inorganic layer, an organic layer, and a second inorganic layer stacked in this order. In this embodiment, when the first organic layer 401 and the second organic layer 402 of the bending sub-area 202 respectively have the same layer as the corresponding layer of the display region 100, since the total thickness of the substrate 1 is usually 3 times of the total thickness of the first organic layer 401, the metal wiring layer 211 and the second organic layer 402 arranged above, the bending neutral layer 212 (shown in FIGS. 1 to 8) of the bending sub-area 202 is usually located on the substrate 1, or located at a longer distance at the side of the metal wiring layer 211 close to the substrate 1. On the basis of ensuring the realization of the process, by the thickness adjusting layer 500, the bending neutral layer 212 of the bending sub-area 202 is still located at the side of the metal wiring layer 211 facing the substrate 1.

The flexible display substrate according to the above-described embodiment of the present disclosure may be formed such that the layers of the non-display region 200 are simultaneously formed when the driving circuit layer and the light emitting device layer are formed in the display region of the substrate 1.

In addition, in the embodiment of the present disclosure, the thickness adjusting layer 500 of the bending sub-area 202 is not limited to be formed by extending the encapsulation layer 800 through the display region 100. For example, the total thickness of the bending sub-area 202 may be adjusted by separately preparing the thickness adjusting layer 500 in the bending sub-area 202, so that the metal wiring layer 211 is close to the bending neutral layer 212 of the bending sub-area 202.

Optionally, a separately prepared thickness adjusting layer 500 is located at a side of the second organic layer 402 away from the substrate 1, and after the encapsulation layer 800 is prepared in the display area 100, a step of further preparing the thickness adjusting layer 500 on the second organic layer 402 of the non-display area 200 farthest from the substrate 1 is further included based on the arrangement.

Optionally, the thickness adjusting layer 500 of the bending sub-area 202 may also extend to the display region 100 and be located at a side of the touch wiring layer 900 away from the substrate 1.

In one embodiment, the thickness adjusting layer 500 is an organic material layer.

In the above embodiments of the present disclosure, the thickness adjusting layer 500 is arranged at a side of the second organic layer 402 away from the metal wiring layer 211 in the bending sub-area 202. The thickness adjusting layer 500 is not limited to be only at this position, and may be between the first organic layer 401 and the metal wiring layer 211, or between the second organic layer 402 and the metal wiring layer 211, for example.

According to another embodiment of the flexible display substrate disclosed by the disclosure, according to the specific structures of the display area and the non-display area, a structure in which the vertical distance from the central plane of the metal wiring layer to the bending neutral layer is less than the preset distance is realized, and the structure is not limited to a mode of only increasing the thickness adjusting layer, and for example, the structure can also be realized by reasonably setting the thickness of the extension layer of each display area on the non-display area.

In the above embodiments of the present disclosure, a specific implementation structure of the flexible display substrate of the present disclosure is described by taking an example that the source/drain layer of the display area extends to the non-display area, the source/drain layer extending to the non-display area is formed as a metal wiring layer of the non-display area, and a vertical distance from a central plane of the metal wiring layer of the non-display area to the bending neutral layer is smaller than a preset distance by providing a thickness adjusting layer.

Further, the flexible display panel of the present disclosure is not limited to being applicable only to the above-described implementation structure.

Figure 11:
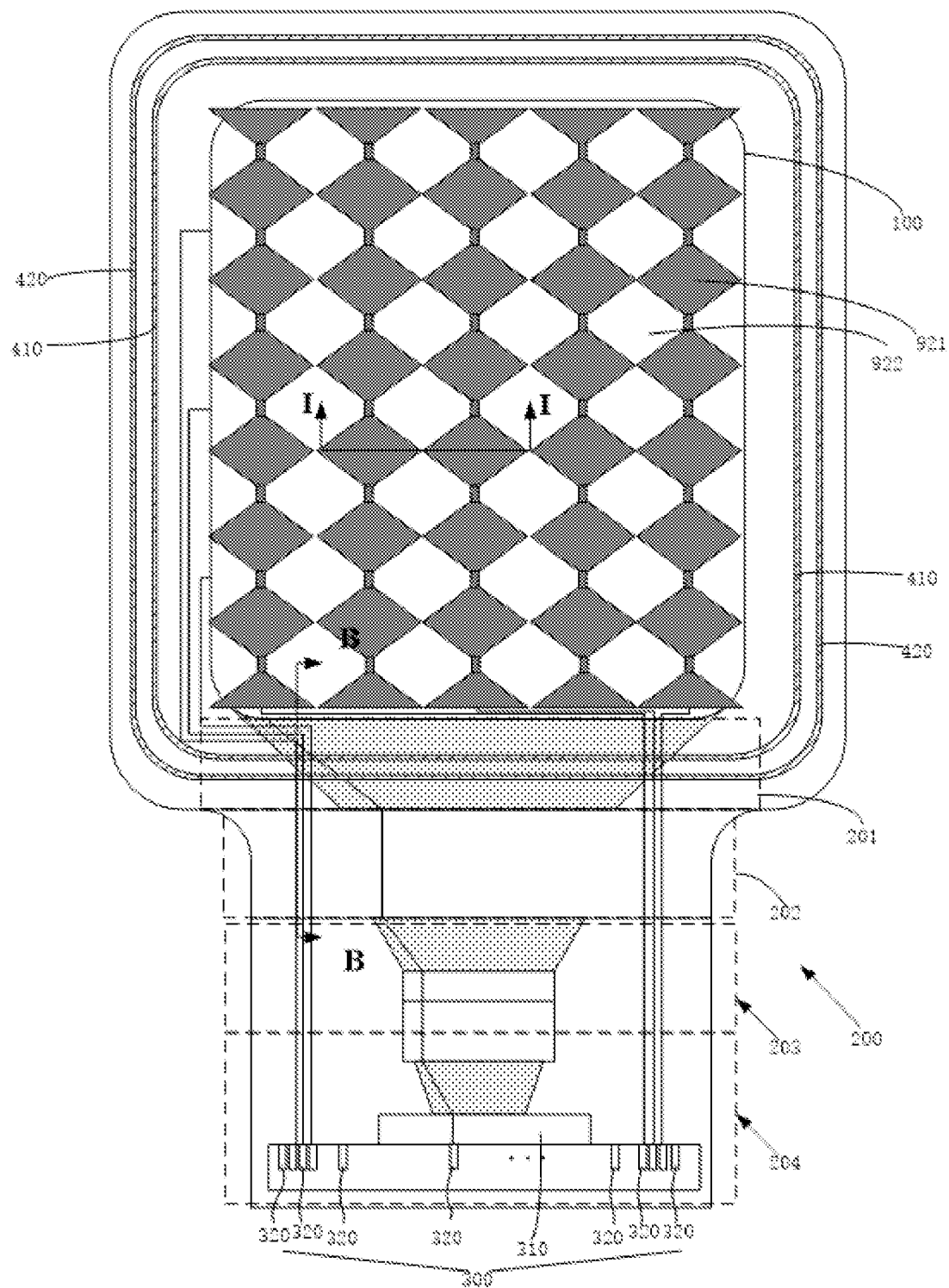
FIG. 11 is a schematic plan view of a flexible display panel according to another embodiment of the present disclosure.

For example, in another embodiment of the flexible display panel according to the present disclosure, the flexible display panel is a display panel with a touch function, and a touch wiring layer is arranged in the display area, as shown in FIG. 11, in the display area 100, the touch wiring layer includes a plurality of first touch electrodes 921 arranged along a first direction and a plurality of second touch electrodes 922 arranged along a second direction.

According to FIG. 11, in the embodiment of the present disclosure, at one edge of the display area 100, the flexible display panel extends to form a non-display area 200 in a direction away from the edge, and from a direction close to the display area 100 to a direction away from the display area 100, the non-display area 200 includes a first transition sub-area 201, a bending sub-area 202, a second transition sub-area 203, and a binding sub-area 204, where the binding sub-area 204 is with a driving component 300.

Optionally, the drive assembly 300 includes a control chip 310 and a plurality of line terminals 320. Some of the plurality of line terminals 320 are connected to the first touch electrodes 921 of the display area 100 arranged along the first direction through connection lines, for inputting touch scan signals to the first touch electrodes 921; another portion of the plurality of line terminals 320 is connected to the second touch electrodes 922 arranged along the second direction of the display area 100 through the connection lines, for obtaining touch sensing signals on the second touch electrodes 922. The first touch electrodes 921 arranged along the first direction and the second touch electrodes 922 arranged along the second direction are intersected with each other, and a touch scanning signal is input to the plurality of first touch electrodes 921 according to a preset frequency to obtain an induction signal on each second touch electrode 922, so that a touch operation position on the flexible display panel may be determined.

In the embodiment of the present disclosure, the region of the non-display area 200 where the driving element 300 is arranged is the binding sub-area 204, and on the non-display area 200, the bending sub-area 202 is located between the binding sub-area 204 and the display area 100. Through the bending sub-area 202, the binding sub-area 204 may be bent to a state opposite to the display region 100, so that the driving element 300 arranged on the binding sub-area 204 is opposite to the display region 100.

In the embodiment of the present disclosure, as shown in FIG. 11, a first blocking structure 410 and a second blocking structure 420 are further arranged around the display area 100 in the non-display area 200, the first blocking structure 410 is separated from the second blocking structure 420, and are formed in a ring shape arranged around the display area 100 at the periphery of the display area 100, so as to prevent the organic material in the display area 100 from overflowing when the flexible display panel is formed.

Further, on the non-display area 200, the portions of the first blocking structure 410 and the second blocking structure 420 surrounding the edge of the display area 100 close to the bending sub-area 202 are located on the first transition sub-area 201.

In one embodiment, a metal wiring layer is arranged on the bending sub-area 202, and the metal wiring layer may be connected to a power line of the display region 100, a data line of the display region 100, the first touch electrode 921 of the display region 100, or the second touch electrode 922 of the display region, so that the power line, the data line, and the touch wiring are connected to the driving component 300 through the metal wiring layer.

Since the thickness of each layer in the display region is typically in a predetermined range during the fabrication of the display device, the thickness of the inorganic layer is in the range of 1000 to 6000 angstroms, the thickness of the organic layer is in the range of 10000 to 25000 angstroms, for example, in a display device, the substrate 1 is about 90000 angstroms to about 110000 angstroms, e.g., 100000 angstroms, the gate insulating layer 602 is about 1200 angstroms to about 1400 angstroms, such as 1300 angstroms, the interlayer dielectric layer 604 is about 4900 to 5100 angstroms, e.g., 5000 angstroms, the pixel definition layer 703 is typically 14000 to 16000, e.g. 15000 a, the planarization layer 607 is typically 19000-21000 a, e.g. 20000 a, in the bending sub-area 202, since the thickness of the substrate 1 is much larger than the thickness of the layers on the substrate, in order to ensure that, in the meander sub-area 202, the perpendicular distance of the meander neutral layer of the meander sub-area 202 to the metal wiring layer 211 is smaller than a preset distance, optionally, on the bending sub-area 202, the overall thickness of the bending sub-area 202 is adjusted by a thickness adjusting layer.

Therefore, the thickness adjusting layer is arranged on the bending sub-area 202 of the flexible display panel, and the vertical distance between the metal wiring layer and the bending neutral layer of the bending sub-area 202 is smaller than the preset distance by arranging the thickness adjusting layer, so as to avoid the problem that the metal wiring layer of the bending sub-area 202 is easy to break.

Figure 12:
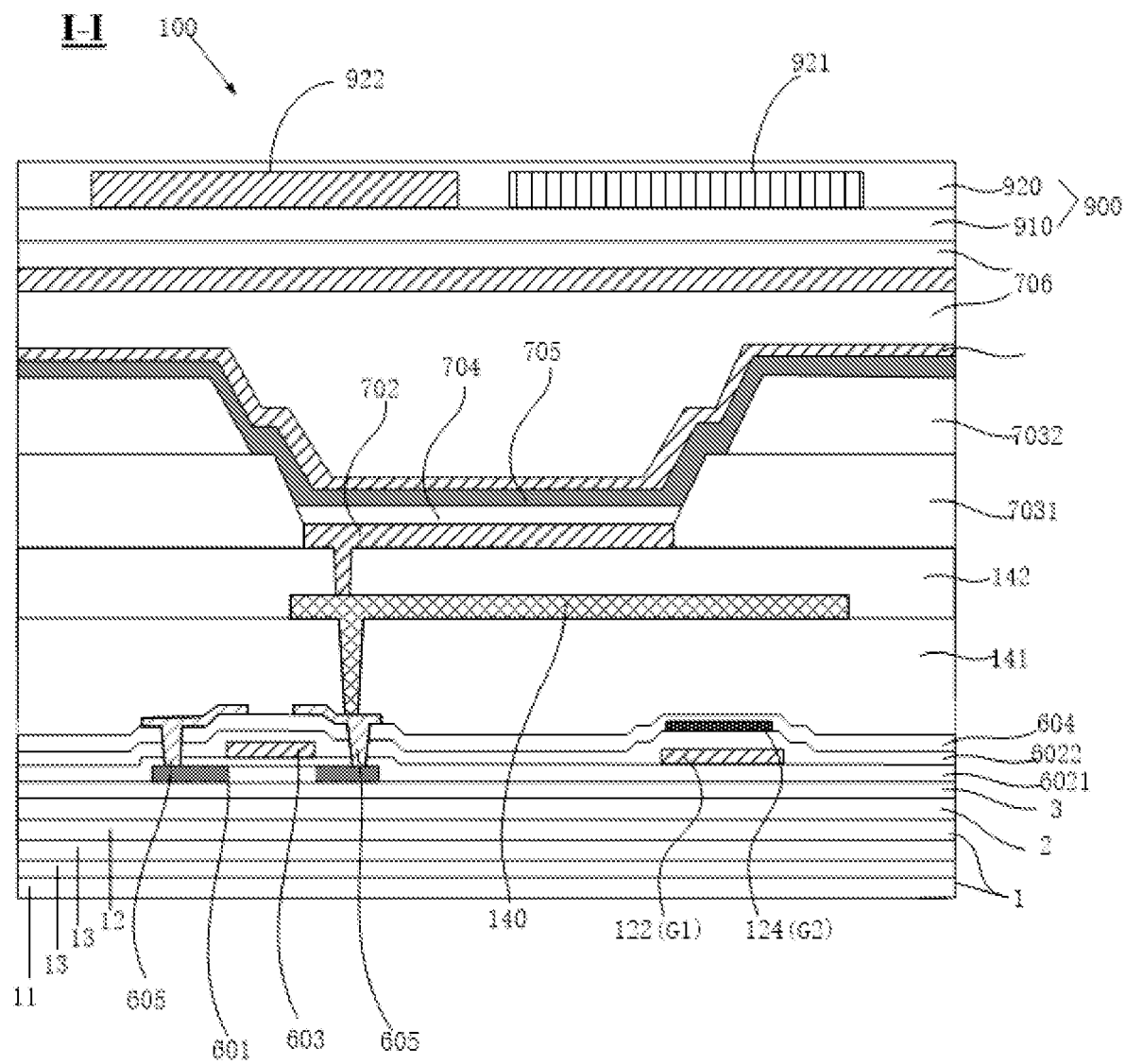
FIG. 12 is a schematic sectional view taken along line I-I in FIG. 11.
Figure 13:
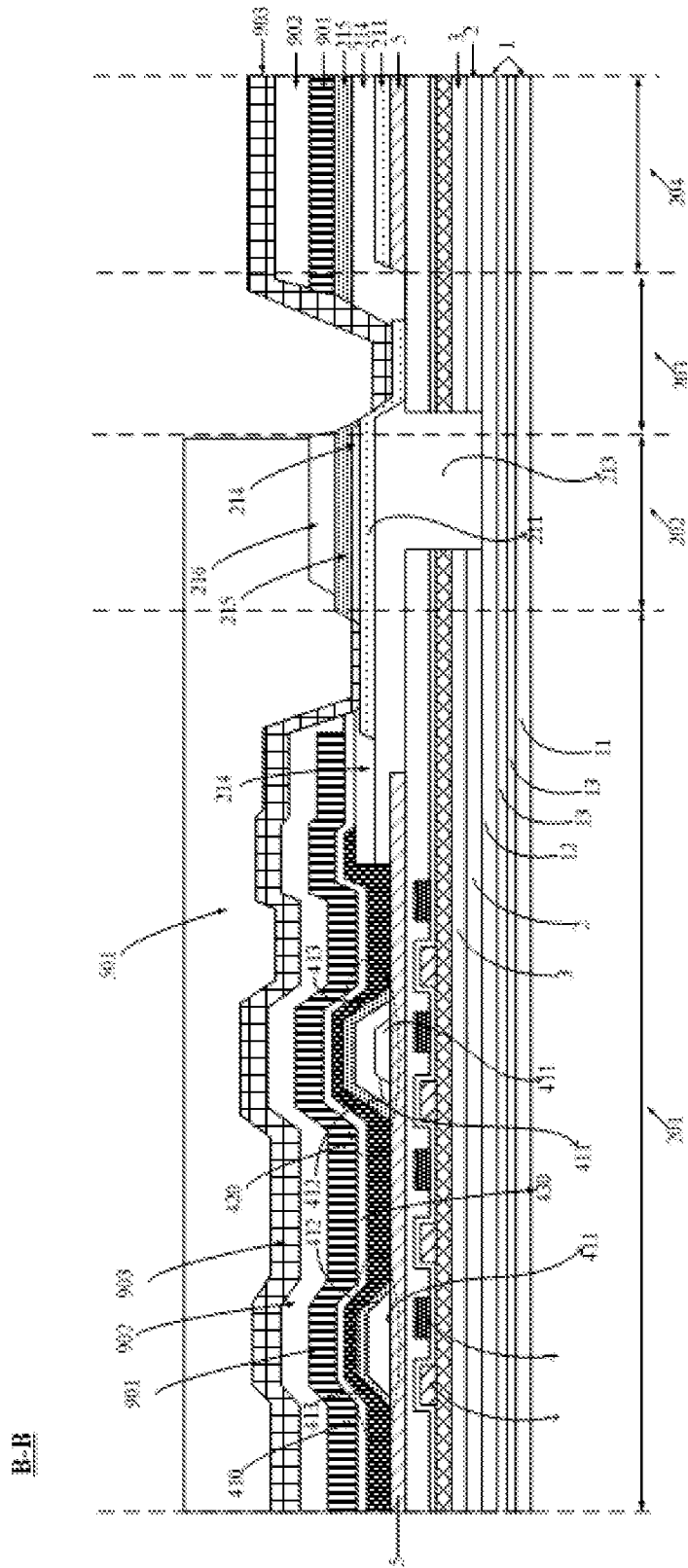
FIG. 13 is a cross-sectional view of part B-B of FIG. 11.

Referring to FIGS. 12 and 13 in combination with FIG. 11, a display area 100 of the flexible display panel includes a substrate 1, and a barrier layer 2 and a buffer layer 3 sequentially stacked on the substrate 1 from bottom to top.

The buffer layer 3 is with a driving circuit layer, the driving circuit layer includes a plurality of thin film transistor TFTs, and the TFTs include a first gate insulating layer 6021, an active layer 601, a second gate insulating layer 6022, a gate 603, an interlayer insulating layer 604, and a source/drain layer 605, which are sequentially stacked on the buffer layer 3 from bottom to top. Further, in this embodiment, the active layer 601 is polarized as an electric conductor, and is connected to the source and drain electrodes of the thin film transistor TFT, respectively, to enhance the sensitivity of the control of the thin film transistor TFT.

Optionally, in the embodiment of the present disclosure, the driving circuit layer may further include an inorganic insulating layer, such as silicon nitride or silicon oxide, covering the source/drain layer 605 for protecting the source/drain layer 605 from water and oxygen.

In this embodiment, optionally, a first electrode plate 122 and a second electrode plate 124 are further in the second gate insulating layer 6022 and the interlayer insulating layer 604 to form a storage capacitor, respectively.

Further, the flexible display panel of the present disclosure further includes a light emitting device layer on the driving layer, where a transition metal layer 140 is arranged between the light emitting device layer and the driving layer. Specifically, as shown in FIG. 12, a first planarization layer 141, a transition metal layer 140, and a second planarization layer 142 are sequentially formed on the thin film transistor TFT from bottom to top; the first planarization layer 141 is with a via hole, and the transfer metal layer 140 penetrates through the via hole to be electrically connected to the source or the drain of the thin film transistor TFT.

Optionally, the transfer metal layer 140 may be made of the same material as the source/drain layer 605, and the flexible display panel may also include an inorganic passivation layer PVX, such as silicon nitride or silicon oxide, covering the transfer metal layer 140 for protecting the transfer metal layer 140 from water and oxygen.

In addition, the light emitting device layer includes:
- a first pixel defining layer 7031 and a second pixel defining layer 7032 which are sequentially arranged on the second planarization layer 142;
- a first electrode 702 and a light-emitting layer 704 in the first pixel defining layer 7031 and the second pixel defining layer 7032;
- a second electrode 705 arranged on the second pixel defining layer 7032.

Further, the flexible display panel is with a spacer layer 706 on the light emitting device layer, and, optionally, the spacer layer 706 includes at least three sub-layers.

Referring to FIG. 12, the flexible display panel further includes a touch wiring layer 900 arranged on the spacer layer 706, the touch wiring layer 900 includes an insulating layer 910 and a first organic layer 920 arranged on the insulating layer 910, where a plurality of first touch electrodes 921 and second touch electrodes 922 are formed in the first organic layer 920.

In the flexible display panel with the above-described implementation structure, the touch wiring layer 900 is further formed above the light emitting device layer, so as to implement the touch function of the flexible display panel.

It should be noted that the first touch electrode 921 and the second touch electrode 922 on the touch wiring layer 900 may be transparent electrode blocks, or may be in a metal grid structure. In addition, when the first touch electrode 921 and the second touch electrode 922 are respectively an electrode block, one electrode block of the first touch electrode 921 and the second touch electrode 922 corresponds to one light emitting layer 704 of the light emitting device layer, or one electrode block corresponds to a plurality of light emitting layers 704, and the present disclosure is not limited thereto, which may be adjusted by a person skilled in the art according to the touch precision. FIG. 11 only schematically shows the correspondence between the first touch electrode 921 and the second touch electrode 922, and the light-emitting layer 704. With reference to FIG. 11 and FIG. 13, based on the structure of the display area 100 of the flexible display panel in the foregoing embodiment, in the flexible display panel of this embodiment, the non-display area 200 includes a first transition sub-area 201, a bending sub-area 202, a second transition sub-area 203, and a binding sub-area 204, which are sequentially arranged from the display area 100 to the edge direction of the flexible display panel.

Referring to FIG. 13, in the embodiment of the present disclosure, the first transition sub-area 201 includes the substrate 1, the barrier layer 2, and the buffer layer 3 in the same layers as the substrate 1, the barrier layer 2, and the buffer layer 3 of the display region 100, respectively. Optionally, the barrier layer 2 and the buffer layer 3 are inorganic layers, and are made of silicon nitride or silicon oxide materials.

Further, the first transition sub-area 201 further includes at least two insulating layers located on the buffer layer 3, the at least two insulating layers are respectively in the same layer as the first gate insulating layer 6021 and the second gate insulating layer 6022 of the display region 100, a plurality of array signal lines 4 are respectively arranged in each insulating layer, for example, the signal lines 4 transmit data signals, and the plurality of signal lines 4 are respectively insulated by the insulating layers. In the embodiment, the signal lines 4 may be arranged in a same layer with the gate metal layer in the display area.

In addition, a power metal line 5 is further arranged above the signal line 4 arranged in the first transition sub-area 201, and a first blocking structure 410 and a second blocking structure 420 are formed on the power metal line 5. The first blocking structure 410 and the second blocking structure 420 respectively include a third planarization layer 411, a third pixel defining layer 412, and an encapsulation layer 413 covering the blocking structures, which are sequentially stacked from bottom to top. Wherein the second barrier structure 420 includes two stacked third planarization layers 411 to increase the height of the second barrier structure 420 compared to the first barrier structure 410 closer to the display area 100.

Optionally, in the embodiment of the present disclosure, the third planarization layer 411 in the first barrier structure 410 and the second barrier structure 420 is arranged in the same layer as the first planarization layer 141 or the second planarization layer 142 of the display area 100; the third pixel defining layer 412 in the first and second barrier structures 410 and 420 is arranged in the same layer as the first pixel defining layer 7031 of the display area 100; the encapsulation layer 413 in the first barrier structure 410 and the second barrier structure 420 is arranged at the same layer as the spacer layer 706 of the display area 100.

Further, optionally, the first transition sub-area 201 further includes a buffer layer 430 sequentially located on the first blocking structure 410 and the second blocking structure 420, a touch wiring layer 900 located on the buffer layer 430, and a second organic layer 501 located on the touch wiring layer 900. Optionally, the buffer layer 430 may be an inorganic layer, or may have a structure in which an inorganic layer is stacked over an organic layer.

Optionally, the touch wiring layer 900 includes a first touch trace 901, an insulating layer 902, and a second touch trace 903 arranged in sequence. One of the first touch trace 901 and the second touch trace 903 is connected to the first touch electrode 921 of the display area 100, and the other of the first touch trace 901 and the second touch trace 903 is connected to the second touch electrode 922 of the display area 100.

In the embodiment of the present disclosure, optionally, one of the first touch lines 901 and one of the second touch lines 903 form a group, and are connected in parallel or directly connected by via holes in a direction perpendicular to the substrate 1, so as to reduce the trace resistance. The first touch lines 901 and the second touch lines 903 connected as a group are respectively connected to the touch electrodes and the sensing electrodes of the display area 100 in a one-to-one correspondence manner.

Optionally, the second organic layer 501 of the first transition sub-area 201 is arranged in the same layer as the first organic layer 920 of the display region 100.

Further, in the embodiment of the present disclosure, the bending sub-area 202 includes: the liquid crystal display comprises a substrate 1, and a fourth planarization layer 213, a metal wiring layer 211, a fifth planarization layer 214, a fourth pixel definition layer 215, a spacer layer 216 and a second organic layer 501 which are sequentially arranged on the substrate 1.

Optionally, the fourth planarization layer 213 of the bending sub-area 202 and the first planarization layer 141 of the display region 100 are arranged on the same layer, the metal wiring layer 211 of the bending sub-area 202 and the transfer metal layer 140 of the display region 100 are arranged on the same layer, and the metal wiring layer 211 is connected to the second touch circuit 902 of the first transition sub-area 201; the fifth planarization layer 214 of the bending sub-area 202 is arranged on the same layer as the second planarization layer 142 of the display region 100; the fourth pixel defining layer 215 of the bending sub-area 202 is arranged in the same layer as the first pixel defining layer 7031 or the second pixel defining layer 7032 of the display region 100; the spacer layer 216 of the bending sub-area 202 is arranged on the same layer as the second pixel defining layer 7032 of the display region 100; the second organic layer 501 of the bending sub-area 202 is an extension layer of the second organic layer 510 of the first transition sub-area 201, and is arranged in the same layer as the first organic layer 920 of the display region 100.

In the above implementation structure of the present disclosure, the metal wiring layer 211 is a transfer metal layer for inputting a touch signal to the second touch line 902. In addition, since the second organic layer 501 is arranged on the bending sub-area 202 away from the substrate 1, the second organic layer 501 is formed as a thickness adjusting layer of the bending sub-area 202, and as shown in FIG. 3, the arrangement of the second organic layer 501 can make the vertical distance h from the central plane 2111 of the metal wiring layer 211 to the bending neutral layer 212 smaller than a preset distance, so as to ensure that the metal wiring layer 211 is arranged as close to the bending neutral layer 212 as possible, thereby reducing the stress of the metal wiring layer 211 on the bending sub-area 202 and avoiding a fracture of the metal wiring layer 211.

Further, with reference to FIG. 13, in the embodiment of the present disclosure, the binding sub-area 204 includes a substrate 1, a blocking layer 2, a buffer layer 3, at least two insulating layers, a power metal line 5, a metal wiring layer 211, a second planarization layer 142, a buffer layer 225, a first touch line 901, an isolation layer 902, and a second touch line 902, which are respectively extended from the corresponding layers of the display region 100, the first transition sub-area 201, and the bending sub-area 202.

Based on the above embodiment, on the substrate, from the peripheral region close to the display region to the bending sub-area, the touch circuit is wired in double layers, the layers of the bending sub-area are replaced by the metal wiring layer, and after passing through the bending sub-area, the double layers of touch circuit are continuously wired in the binding sub-area. In addition to the way of disposing the second organic layer 501 on the bending sub-area 202 to form the thickness adjusting layer of the bending sub-area 202, so that the metal wiring layer 211 is arranged as close to the bending neutral layer 212 as possible, the flexible display panel according to the embodiments of the present disclosure may further include a substrate 1 as the thickness adjusting layer, so that the substrate 1 includes at least four layers of layer structures, as shown in FIG. 11, the substrate 1 may include a first PI material 11, a second PI material 12 and at least two inorganic layers 13 between the first PI material and the second PI material, which are arranged oppositely, and by changing the structural composition and thickness of the substrate 1, the overall thickness of the bending sub-area 202 may be adjusted, so as to achieve the purpose of adjusting the position of the metal wiring layer 211 relative to the bending neutral layer 212.

In one embodiment of the present disclosure, as shown in FIG. 13, the thickness adjusting layer (the second organic layer 501) on the bending sub-area 202 may extend to the display region 100 and cover a side of the touch wiring layer away from the substrate.

Figure 14:
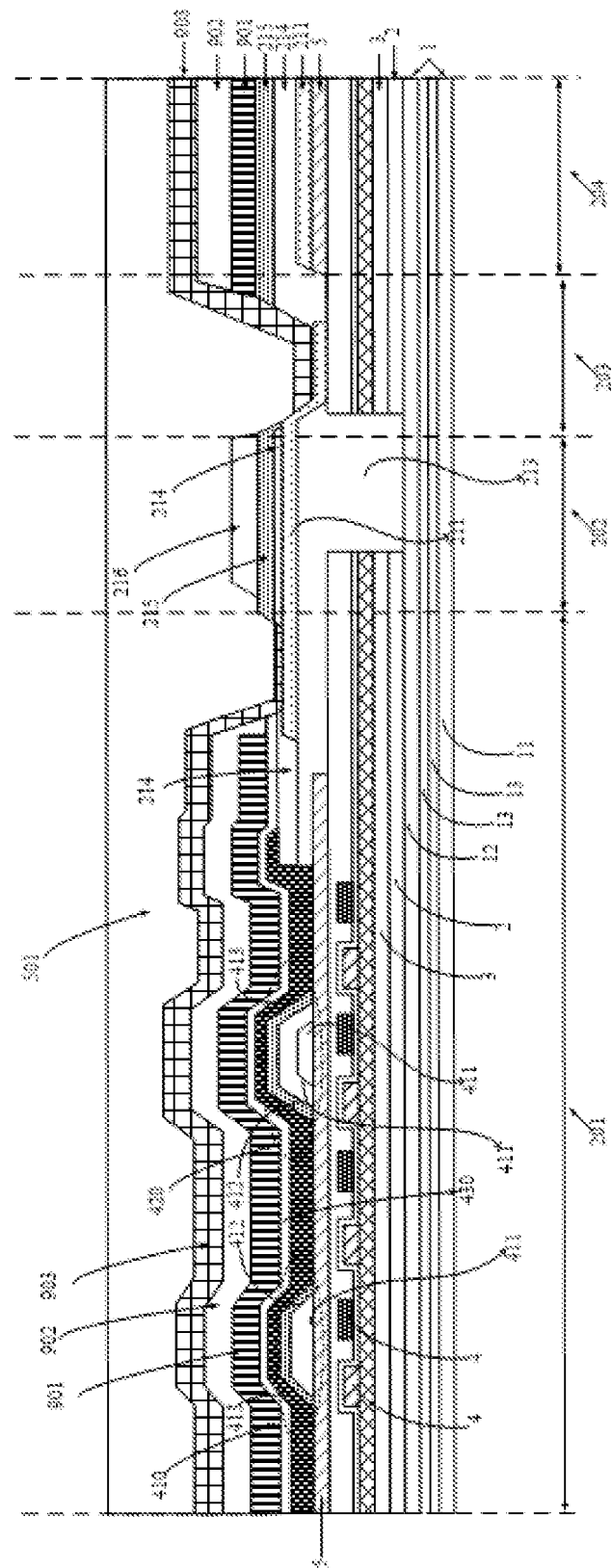
FIG. 14 is a second cross-sectional view of the portion B-B in FIG. 11.

In the flexible display panel according to the above embodiment of the present disclosure, the second organic layer 501 is arranged on the bending sub-area 202 for adjusting the overall thickness of the bending sub-area 202, where in an embodiment, as shown in FIG. 14, the second organic layer 501 may extend to the second transition sub-area 203 and the binding sub-area 204 in addition to the first transition sub-area 201, and covers the second transition sub-area 203 and the binding sub-area 204 on the surface away from the substrate 1.

In another embodiment of the flexible display panel of the present disclosure, optionally, according to the description of the above embodiments of the flexible display panel, the bending sub-area 202 is not limited to be able to adjust the position of the metal wiring layer 211 relative to the bending neutral layer 212 only by disposing a thickness adjusting layer on the outermost surface far away from the substrate 1, and as shown in FIG. 8, the bending sub-area 202 may also adjust the position of the metal wiring layer 211 relative to the bending neutral layer 212 by disposing a thickness adjusting layer between the first organic layer and the metal wiring layer, or between the second organic layer and the metal wiring layer.

Figure 15:
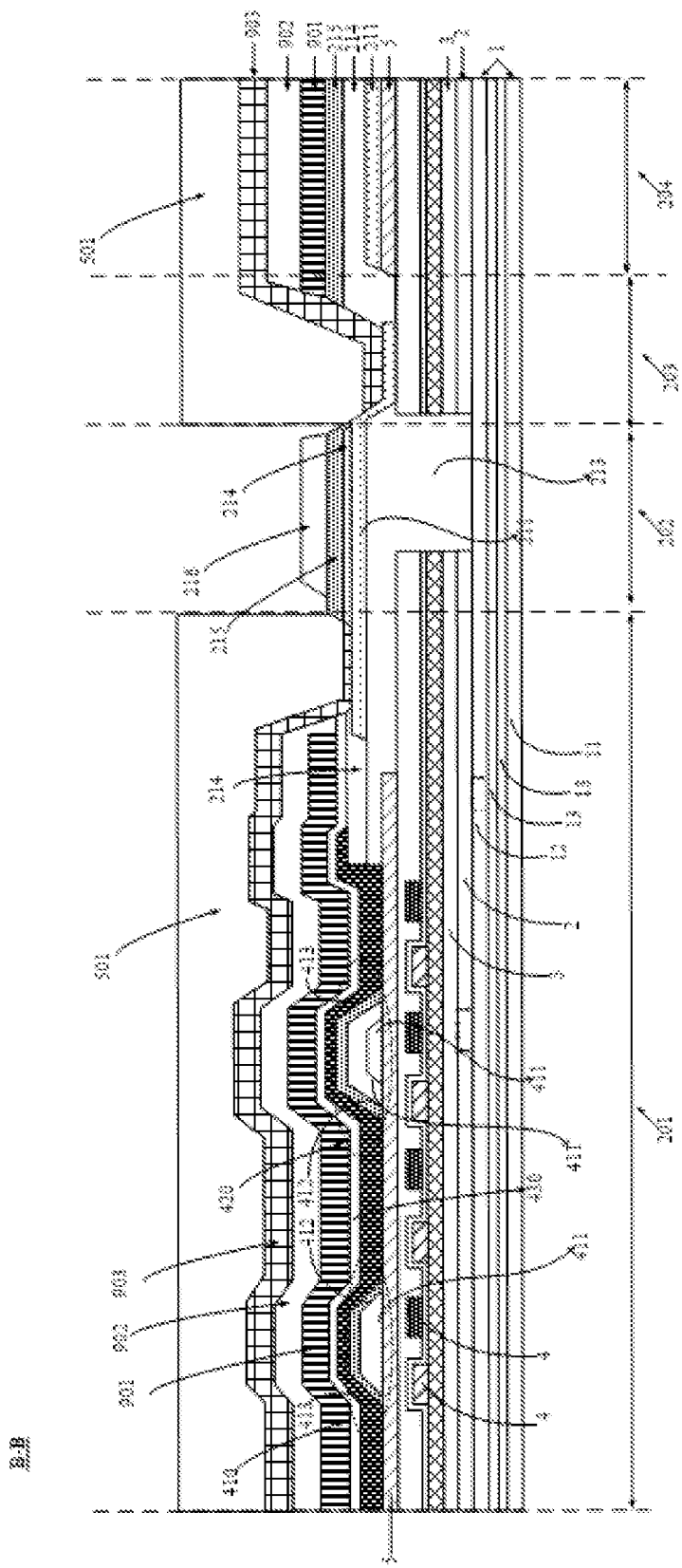
FIG. 15 is a second cross-sectional view of the portion B-B in FIG. 11.

Based on this embodiment, when the surface of the bending sub-area 202 away from the substrate 1 does not need to be with the thickness adjusting layer, that is, the second organic layer 501 is not provided, the structure of the flexible display panel in the non-display region is as shown in FIG. 15.

It should be noted that, in the present disclosure, the different film layers mentioned are the same layer, that is, the two film layers are made by the same composition process, or are prepared on the same film layer.

An embodiment of the present disclosure further provides a display device, where the display device includes the flexible display panel described in any one of the above.

In the embodiment of the disclosure, on the non-display area, a driving component is arranged at a side of the bending sub-area, which is far away from the display area, and the metal wiring layer is electrically connected to the driving component;

the bending sub-area is bent relative to the display area, and the driving component is arranged at a side away from the display area.

Optionally, the driving component includes a driving chip and a flexible printed circuit board, and as shown in FIG. 2, by bending the bending sub-area 202 toward a side away from the display region 100 with respect to the display region 100, the driving component 300 located on the non-display region 200 and far away from the display region 100 may be bent to the back of the display region 100, so as to complete the next step of module assembly, thereby achieving the effects of reducing the display frame of the display region 100 of the flexible display panel and realizing narrow-frame display.

According to the flexible display panel and the display device, the vertical distance h from the metal wiring layer to the bending neutral layer is smaller than the preset distance, so that the metal wiring layer is arranged close to the bending neutral layer as much as possible, the stress of the metal wiring layer on the bending sub-area is reduced, the metal wiring layer is prevented from being broken, and the yield of the bending sub-area is improved.

Furthermore, the thickness adjusting layer is arranged at the position, far away from the substrate, of the bending sub-area, so that the vertical distance h from the metal wiring layer to the bending neutral layer is smaller than the preset distance.

Another aspect of the present disclosure also provides a method for forming the flexible display panel, where the method includes:

providing a substrate;

forming a display area and a non-display area on the substrate;

the non-display area comprises a bending sub-area and a binding sub-area, and the bending sub-area is configured to bend the binding sub-area to a side away from the display area;

the display area comprises a driving circuit layer, the driving circuit layer comprises a source/drain electrode layer, a planarization layer arranged at a side, far away from the substrate, of the source/drain electrode layer, a pixel defining layer arranged at a side, far away from the substrate, of the planarization layer and a touch wiring layer arranged at a side, far away from the substrate, of the pixel defining layer, the bending sub-area comprises a first organic layer, a second organic layer and a metal wiring layer, the first organic layer and the second organic layer are arranged on the substrate, the metal wiring layer is located between the first organic layer and the second organic layer, the touch wiring layer is electrically connected to the metal wiring layer, and the orthographic projection of the touch wiring layer on the plane of the substrate is not located in the bending sub-area;

when the bending sub-area is in a bending state, the vertical distance from the bending neutral layer of the bending sub-area to the metal wiring layer is smaller than a preset distance.

Optionally, the metal wiring layer and the source/drain electrode layer are arranged in the same layer when the display region and the non-display region are formed.

Optionally, when the display region and the non-display region are formed, the display region further comprises a first electrode arranged in the pixel defining layer, a light emitting layer arranged at a side of the first electrode away from the substrate, and a second electrode arranged at a side of the light emitting layer away from the substrate; the first electrode is connected to the source/drain electrode layer through a transfer metal layer, and the metal wiring layer and the transfer metal layer are arranged on the same layer.

While the foregoing is directed to embodiments of the present disclosure, it will be appreciated by those skilled in the art that various changes and modifications may be made without away from the principles of the disclosure, and it is intended that such changes and modifications be considered as within the scope of the disclosure.

What is claimed is:

1. A flexible display panel, comprising a display area and a non-display area, wherein the non-display area comprises a bending sub-area and a binding sub-area, and the bending sub-area is configured to bend the binding sub-area to a side away from the display area;

the display area comprises a driving circuit layer arranged on a substrate, the driving circuit layer comprises a source/drain electrode layer, a planarization layer arranged at a side, far away from the substrate, of the source/drain electrode layer, a pixel defining layer arranged at a side, far away from the substrate, of the planarization layer and a touch wiring layer arranged at a side, far away from the substrate, of the pixel defining layer, the bending sub-area comprises a first organic layer, a second organic layer and a metal wiring layer between the first organic layer and the second organic layer arranged on the substrate, the touch wiring layer is electrically connected to the metal wiring layer, and an orthographic projection of the touch wiring layer on a plane of the substrate is not located in the bending sub-area;

in response to the bending sub-area being in a bending state, a vertical distance from a bending neutral layer of the bending sub-area to the metal wiring layer is smaller than a preset distance.

2. The flexible display panel according to claim 1, wherein the metal wiring layer is arranged in a same layer as the source/drain electrode layer.

3. The flexible display panel according to claim 1, wherein the display region further comprises a first electrode within the pixel defining layer, a light-emitting layer at a side of the first electrode away from the substrate and a second electrode at a side of the light-emitting layer away from the substrate; the first electrode is connected to the source/drain electrode layer through a transfer metal layer, and the metal wiring layer and the transfer metal layer are arranged on the same layer.

4. The flexible display panel according to claim 3, wherein the planarization layer comprises a first planarization layer and a second planarization layer, wherein the transfer metal layer is on the first planarization layer and within the second planarization layer, and the transfer metal layer is connected to the source/drain electrode layer through a first via hole penetrating through the first planarization layer; the first electrode is connected to the transfer metal layer through a second via hole penetrating through the second planarization layer.

5. The flexible display panel according to claim 4, wherein the first organic layer is closer to the substrate than the second organic layer, the first organic layer is in the same layer as the first planarization layer, the second organic layer is in the same layer as the second planarization layer and the pixel defining layer.

6. The flexible display panel according to claim 1, wherein the bending neutral layer overlaps the metal wiring layer in response to the bending sub-area being in a bent state.

7. The flexible display panel according to claim 1, wherein the metal wiring layer is located at one-half of a thickness of the bending sub-area in response to the bending sub-area being not in the bent state.

8. The flexible display panel according to claim 1, wherein a thickness adjusting layer is at a side of the second organic layer away from the metal wiring layer in the bending sub-area;

through the thickness adjusting layer, in response to the bending sub-area being in a bending state, a vertical distance from the bending neutral layer of the bending sub-area to the metal wiring layer is smaller than a preset distance.

9. The flexible display panel according to claim 8, wherein the thickness adjusting layer further extends to the display area and is located at a side of the touch wiring layer away from the substrate.

10. The flexible display panel according to claim 8, wherein the thickness adjusting layer is an organic material layer.

11. The flexible display panel according to claim 1, wherein the substrate comprises a first organic material, a second organic material, and at least one inorganic layer between the first organic material and the second organic material.

12. The flexible display panel according to claim 1, wherein the bending neutral layer is located at a side of the metal wiring layer proximate to the substrate.

13. The flexible display panel according to claim 1, wherein the preset distance is less than or equal to 5 microns.

14. A display device, comprising a flexible display panel;

wherein the flexible display panel comprises a display area and a non-display area, wherein the non-display area comprises a bending sub-area and a binding sub-area, and the bending sub-area is configured to bend the binding sub-area to a side away from the display area;

the display area comprises a driving circuit layer arranged on a substrate, the driving circuit layer comprises a source/drain electrode layer, a planarization layer arranged at a side, far away from the substrate, of the source/drain electrode layer, a pixel defining layer arranged at a side, far away from the substrate, of the planarization layer and a touch wiring layer arranged at a side, far away from the substrate, of the pixel defining layer, the bending sub-area comprises a first organic layer, a second organic layer and a metal wiring layer between the first organic layer and the second organic layer arranged on the substrate, the touch wiring layer is electrically connected to the metal wiring layer, and an orthographic projection of the touch wiring layer on a plane of the substrate is not located in the bending sub-area;

in response to the bending sub-area being in a bending state, a vertical distance from a bending neutral layer of the bending sub-area to the metal wiring layer is smaller than a preset distance.

15. The display device according to claim 14, wherein a driving component is arranged on the binding sub-area on the non-display region, and the metal wiring layer is electrically connected to the driving component;

the bending sub-area is bent relative to the display area, and the driving component is arranged at a side away from the display area.

16. A method of forming a flexible display panel, comprising:
- providing a substrate; and
- forming a display area and a non-display area on the substrate;
- wherein the non-display area comprises a bending sub-area and a binding sub-area, and the bending sub-area is configured to bend the binding sub-area to a side away from the display area;
- the display area comprises a driving circuit layer arranged on a substrate, the driving circuit layer comprises a source/drain electrode layer, a planarization layer arranged at a side, far away from the substrate, of the source/drain electrode layer, a pixel defining layer arranged at a side, far away from the substrate, of the planarization layer and a touch wiring layer arranged at a side, far away from the substrate, of the pixel defining layer, the bending sub-area comprises a first organic layer, a second organic layer and a metal wiring layer between the first organic layer and the second organic layer arranged on the substrate, the touch wiring layer is electrically connected to the metal wiring layer, and an orthographic projection of the touch wiring layer on a plane of the substrate is not located in the bending sub-area;
- in response to the bending sub-area being in a bending state, a vertical distance from a bending neutral layer of the bending sub-area to the metal wiring layer is smaller than a preset distance.

* * * * *